United States Patent
Uezato et al.

(10) Patent No.: US 10,262,874 B2
(45) Date of Patent: Apr. 16, 2019

(54) SEMICONDUCTOR MODULE RADIATOR PLATE FABRICATION METHOD, RADIATOR PLATE, AND SEMICONDUCTOR MODULE USING THE SAME

(71) Applicant: FUJI ELECTRIC CO., LTD., Kawasaki (JP)

(72) Inventors: Yoshinori Uezato, Kawasaki (JP); Masayuki Soutome, Kawasaki (JP); Rikihiro Maruyama, Kawasaki (JP); Tomoaki Goto, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 79 days.

(21) Appl. No.: 15/276,444

(22) Filed: Sep. 26, 2016

(65) Prior Publication Data

US 2017/0011935 A1 Jan. 12, 2017

Related U.S. Application Data

(60) Division of application No. 13/950,928, filed on Jul. 25, 2013, now abandoned, which is a continuation of
(Continued)

(30) Foreign Application Priority Data

Feb. 8, 2011 (JP) ................................ 2011-024610

(51) Int. Cl.
*H01L 21/48* (2006.01)
*H01L 23/36* (2006.01)
(Continued)

(52) U.S. Cl.
CPC .......... *H01L 21/4882* (2013.01); *B23P 15/26* (2013.01); *F28F 3/00* (2013.01);
(Continued)

(58) Field of Classification Search
CPC ............. H01L 21/4803; H01L 21/4878; H01L 21/4882; H01L 23/562; H01L 23/3735;
(Continued)

(56) References Cited

U.S. PATENT DOCUMENTS 5,379,942 A 1/1995 Kuhnert ........................ 228/106
5,629,562 A 5/1997 Nomura ........................ 257/683
(Continued)

FOREIGN PATENT DOCUMENTS

DE 19615481 A1 10/1997
EP 0805492 A2 11/1997
(Continued)

OTHER PUBLICATIONS

Extended European Search Report dated Nov. 27, 2017 in corresponding European Patent Application No. 11858194.1.
(Continued)

*Primary Examiner* — Bayan Salone

(57) ABSTRACT

A semiconductor module radiator plate fabrication method includes soldering a plurality of insulating substrates of different shapes to a flat radiator plate, and forming a convex curve on an insulating substrate side of the radiator plate; obtaining a first concave curve by reversing the convex curve; setting a second concave curve on an insulating substrate side of a radiator plate after soldering, a bottom of the second concave curve being positioned under clearance between the plurality of insulating substrates; adding the first curve and the second curve to calculate a third concave curve on the insulating substrate side; and forming the third curve on a flat plate to form a radiator plate before soldering.

6 Claims, 13 Drawing Sheets

Related U.S. Application Data application No. PCT/JP2011/070035, filed on Sep. 2, 2011.

(51) Int. Cl.
*B23P 15/26* (2006.01)
*F28F 3/00* (2006.01)
*H01L 23/373* (2006.01)
*H01L 23/367* (2006.01)
*H01L 23/00* (2006.01)

(52) U.S. Cl.
CPC ...... *H01L 21/4803* (2013.01); *H01L 21/4878* (2013.01); *H01L 23/3675* (2013.01); *H01L 23/3735* (2013.01); *H01L 23/562* (2013.01); *H01L 2224/32225* (2013.01); *H01L 2224/48091* (2013.01); *H01L 2224/48137* (2013.01); *H01L 2224/48227* (2013.01); *H01L 2224/73265* (2013.01); *Y10T 29/49366* (2015.01)

(58) Field of Classification Search
CPC ....... H01L 23/3675; H01L 2224/32225; H01L 2224/73265; H01L 2224/48227; H01L 2224/48137; H01L 2224/48091; H01L 2924/00; H01L 2924/00014; B23P 15/26; F28F 3/00; Y10T 29/49366
See application file for complete search history.

(56) References Cited

U.S. PATENT DOCUMENTS

| | | | | |
|---|---|---|---|---|
| 6,139,975 | A | 10/2000 | Mawatari | 257/E23.102 |
| 7,632,716 | B2 | 12/2009 | Muraki | 257/E23.101 |
| 7,816,155 | B2* | 10/2010 | Wong | H01L 21/50 |
| | | | | 257/E21.023 |
| 2002/0050637 | A1* | 5/2002 | Sekiya | H01L 21/2007 |
| | | | | 257/701 |
| 2003/0094682 | A1 | 5/2003 | Shinohara | 257/685 |
| 2004/0070052 | A1 | 4/2004 | Janke | 257/618 |
| 2007/0007280 | A1* | 1/2007 | Bayerer | H01L 23/36 |
| | | | | 219/604 |
| 2009/0008773 | A1 | 1/2009 | Wong | 257/720 |
| 2010/0072612 | A1 | 3/2010 | Atkinson, Jr. | |
| 2011/0037167 | A1 | 2/2011 | Iruvanti | |
| 2013/0306296 | A1* | 11/2013 | Uezato | H01L 21/4878 |
| | | | | 165/185 |

FOREIGN PATENT DOCUMENTS

| | | |
|---|---|---|
| JP | 2004096034 A | 3/2004 |
| JP | 2007-49085 | 2/2007 |
| JP | 2007088045 A | 4/2007 |
| JP | 2008091959 A | 4/2008 |
| JP | 2008124298 A | 5/2008 |
| JP | 2009-290118 A | 12/2009 |
| JP | 2010-114263 A | 5/2010 |
| JP | 2010-199251 | 9/2010 |
| JP | 2010-206132 A | 9/2010 |
| WO | WO 03019655 A1 | 3/2003 |
| WO | 2013/002249 A1 | 1/2013 |

OTHER PUBLICATIONS

International Search Report dated Nov. 22, 2011 in corresponding International Application No. PCT/JP2011/070035.
English Translation of Japanese Patent Application Publication No. 2004-096034 dated Mar. 25, 2004.
English Translation of Japanese Patent Application Publication No. 2007-088045 dated Apr. 5, 2007.
English Translation of Japanese Patent Application Publication No. 2008-091959 dated Apr. 17, 2008.
English Translation of Japanese Patent Application Publication No. 2010-199251 dated Sep. 9, 2010.
Restriction dated Aug. 19, 2015 in copending U.S. Appl. No. 13/950,928.
Office Action dated Dec. 18, 2015 in copending U.S. Appl. No. 13/950,928.
Final Office Action dated May 24, 2016 in copending U.S. Appl. No. 13/950,928.
U.S. Appl. No. 13/950,928, filed Jul. 25, 2013, Yoshinori Uezato et al., Fuji Electric Co., Ltd.

* cited by examiner

Y DIRECTION
X DIRECTION

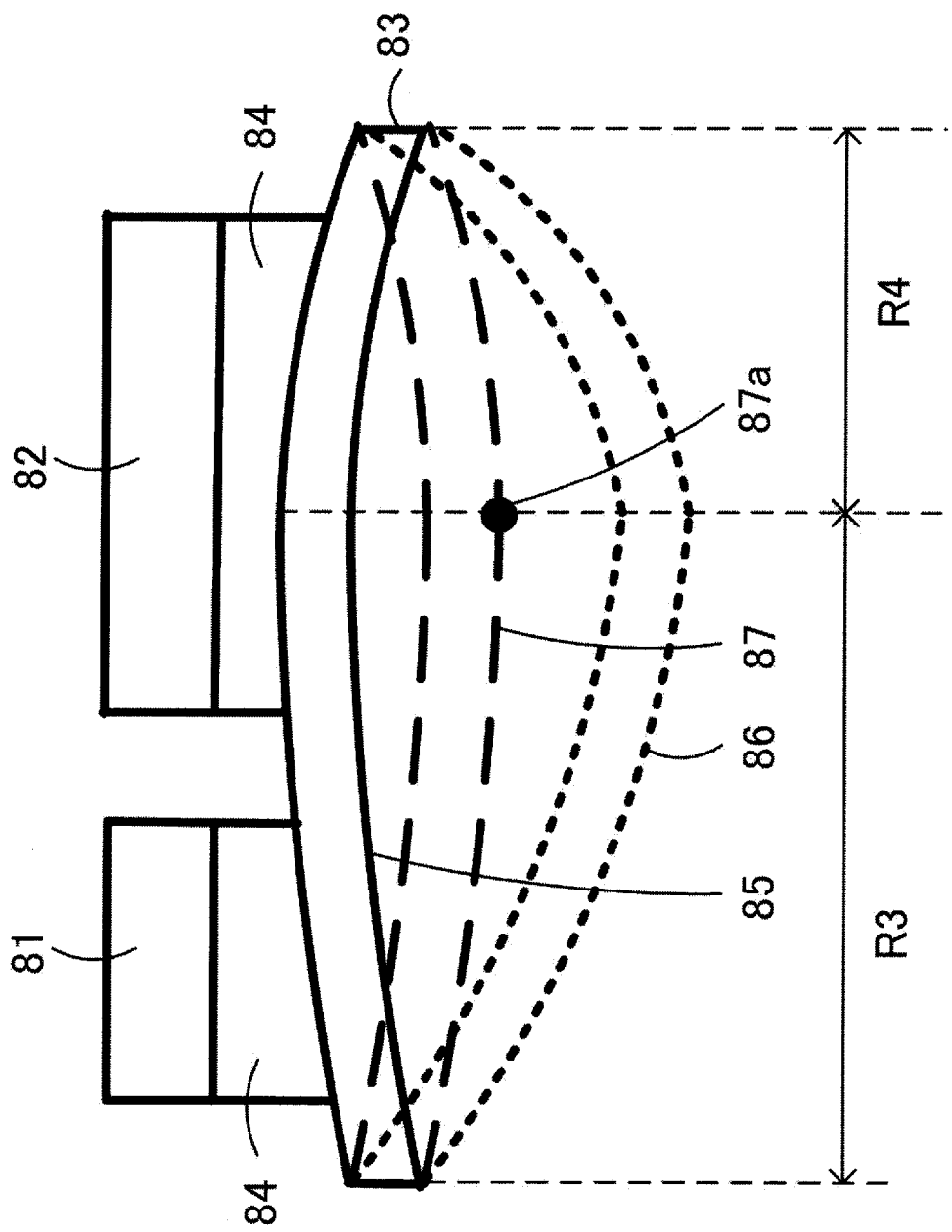

US 10,262,874 B2

SEMICONDUCTOR MODULE RADIATOR PLATE FABRICATION METHOD, RADIATOR PLATE, AND SEMICONDUCTOR MODULE USING THE SAME

CROSS-REFERENCE TO RELATED APPLICATIONS

This application is a divisional of and claims priority benefit to U.S. patent application Ser. No. 13/950,928, filed Jul. 25, 2013, pending, which is a continuation application of International Application PCT/JP2011/070035 filed on Sep. 2, 2011 which designated the U.S., which claims priority to Japanese Patent Application No. 2011-024610, filed on Feb. 8, 2011, the entire contents of which are incorporated herein by reference.

FIELD

The embodiments discussed herein are related to a semiconductor module radiator plate fabrication method, a radiator plate, and a semiconductor module using such a radiator plate.

BACKGROUND

FIG. 7 is a fragmentary sectional view of a semiconductor module. A semiconductor module 500 includes a radiator plate 51, a back electrode film 53 of an insulating substrate with a conductive pattern (hereinafter simply referred to as the insulating substrate 56) which is adhered to the radiator plate 51 with solder 52 between, a semiconductor chip 57 adhered to a conductive pattern 55 formed over the insulating substrate 56 with solder between, a bonding wire 59 which connects a surface electrode (not illustrated) of the semiconductor chip 57 and the conductive pattern 55, a wiring conductor 60 one end of which is connected to the conductive pattern 55, a lead-out terminal 61 to which the other end of the wiring conductor 60 is adhered, a resin case 62 to which the lead-out terminal 61 is adhered, and gel 63 with which the resin case 62 is filled. Clamp holes 64 are made in the radiator plate 51 of the semiconductor module 500 for fixing the radiator plate 51 onto a cooling fin (not illustrated). The above insulating substrate 56 includes the back electrode film 53, an insulating plate 54 which is a ceramic plate or the like, and the conductive pattern 55 formed over its surface. In many cases, the back electrode film 53 and the conductive pattern 55 are formed by the use of copper foil or the like.

FIG. 8 is a fragmentary sectional view of the semiconductor module fixed onto a cooling fin. The semiconductor module 500 is fixed onto a cooling fin 65 by inserting bolts or the like (not illustrated) into the clamp holes 64 made in a periphery of the radiator plate 51.

FIG. 9 is a schematic sectional view of a flat radiator plate to which two insulating substrates of the same shape are soldered. As illustrated in FIG. 7, each insulating substrate 56 is obtained by forming the back electrode film 53 on the back of the insulating plate 54, such as a ceramic plate, and forming the conductive pattern 55 on the front of the insulating plate 54. The coefficient of thermal expansion of the radiator plate 51 made of copper or aluminum is higher than that of each insulating substrate 56, so the radiator plate 51 to which the insulating substrates 56 are soldered curves due to a bimetal effect so that it will be convex on an insulating substrate (insulating substrates 56) side. That is to say, a curve 67 which is convex on the insulating substrate (insulating substrates 56) side is formed on a back 66 of the radiator plate 51. If the radiator plate 51 is attached in this state to the flat cooling fin 65, there will be a big gap 68 in the center of the radiator plate 51, resulting in a decrease in heat radiation efficiency. Measures to prevent this will now be described.

FIG. 10 is a schematic sectional view of a concave curve formed for canceling out the convex curve of the radiator plate illustrated in FIG. 9.

In order to cancel out the convex curve 67 illustrated in FIG. 9, a reverse curve 69 is formed in advance so that the center of the radiator plate 51 will be concave on the insulating substrate (insulating substrates 56) side (which is referred to as reverse curving or initial curving). This reverse curve 69 is formed rather sharp so that the radiator plate 51 will not become convex on the insulating substrate (insulating substrates 56) side even after soldering.

When the insulating substrates 56 are soldered to the radiator plate 51 by which the reverse curve 69 indicated by a dashed line is formed, the convex curve 67 illustrated in FIG. 9 is canceled out and a curve 70 which is concave on the insulating substrate (insulating substrates 56) side is formed. When the radiator plate 51 is attached in this state to the cooling fin 65 by the use of the clamp holes 64, the center of the radiator plate 51 (bottom 70a of the concave curve 70) touches the cooling fin 65, both ends of the radiator plate 51 are pressed against the cooling fin 65 with the bottom 70a as a supporting point, and the whole of the back 66 of the radiator plate 51 adheres to the cooling fin 65.

Furthermore, according to Japanese Laid-open Patent Publication No. 2007-88045, as illustrated in FIG. 11, if insulating substrates 71 and 72 of different shapes are soldered to a radiator plate 73, a sharp curve 74 including concave curves 74a, 74b, and 74c corresponding to the insulating substrates 71 and 72 and clearance between them, respectively, is formed in advance on the radiator plate 73. It is assumed that the sizes of the curves 74a, 74b, and 74c are R10, R20, and R30 respectively. When the insulating substrates 71 and 72 are soldered to the radiator plate 73, the sharp concave curve 74 becomes a gentle concave curve (not illustrated). The radiator plate 73 to which the insulating substrates 71 and 72 are soldered is attached to a cooling fin (not illustrated). As a result, there appears no gap between the radiator plate 73 and the cooling fin.

In addition, according to Japanese Laid-open Patent Publication No. 2008-91959 (not illustrated), when an insulating substrate is adhered to a radiator plate by the use of solder, a concave curve (reverse curve) is formed in advance on an insulating substrate side of the radiator plate and then the insulating substrate is soldered. By doing so, the radiator plate is kept in a reversely curved state (having a concave curve on the insulating substrate side) even after the soldering. By attaching the radiator plate in a reversely curved state to a cooling fin, there appears no gap between the radiator plate and the cooling fin.

In FIG. 10, if the insulating substrates 56 soldered to the radiator plate 51 have the same shape and are arranged left-right symmetrically, then the radiator plate 51 curves left-right symmetrically as a result of the soldering so that its center will be convex on the insulating substrate (insulating substrates 56) side. A bottom 69a of the concave curve 69 which cancels out this curve is positioned at the center of the radiator plate 51, so the concave curve 69 formed on the radiator plate 51 may be managed at a depth at the center of the radiator plate 51. As a result, management can be exercised easily. Next, a case where two insulating substrates of different shapes are soldered to a radiator plate will be described.

FIG. 12 is a schematic sectional view of a radiator plate to which two insulating substrates of different shapes are soldered. When insulating substrates 81 and 82 of different shapes are adhered to a flat radiator plate 83 by the use of solder 84, left-hand and right-hand portions of a convex curve 85 which appears on an insulating substrate (insulating substrates 81 and 82) side after the soldering differ in curvature. Therefore, in order to cancel out the difference in curvature, a concave curve 86 left-hand and right-hand portions of which differ in curvature, that is to say, curvatures of the left-hand and right-hand portions of which are R3 and R4, respectively, may be formed in advance on the radiator plate 83.

When the insulating substrates 81 and 82 are soldered to the radiator plate 83 having the curve 86, the radiator plate 83 is deformed into the radiator plate 83 having a concave curve 87 a bottom 87a of which is positioned under the insulating substrate 82.

With the method of forming the concave curve 86 in this way, a position at which the left-hand and right-hand portions of the curve 86 which differ in curvature, that is to say, the curvatures of which are R3 and R4, respectively, connect deviates from the center and becomes unclear. Accordingly, it is difficult to manage the curve 86.

Furthermore, the curve 86 the left-hand and right-hand portions of which differ in curvature, that is to say, the curvatures of the left-hand and right-hand portions of which are R3 and R4, respectively, may be formed on the radiator plate 83 for canceling out the convex curve 85 which appears as a result of soldering the insulating substrates 81 and 82 of different shapes. Accordingly, the management of the curve 86 is complex.

FIGS. 13A and 13B are schematic views of the radiator plate of FIG. 12 before and after being fixed onto a cooling fin. FIG. 13A is a schematic view of the radiator plate before being fixed onto the cooling fin. FIG. 13B is a schematic view of the radiator plate after being fixed onto the cooling fin. The reference sign 92 in FIGS. 13A and 13B indicates a clamp hole.

As illustrated in FIG. 13A, the bottom 87a of the concave curve 87 is positioned under the rigid insulating substrate 82 having high rigidity. As a result, stress concentrates in clearance 88 having low rigidity between the insulating substrates 81 and 82 and, as illustrated in FIG. 13B, a crack 89 tends to appear in the solder 84, or a crack (not illustrated) tends to appear in the insulating substrate 81 or 82 made of a ceramic. In addition, an end portion of the insulating substrate 82 is lifted up between the insulating substrates 81 and 82 and a gap tends to appear at a contact surface 91 between the radiator plate 83 and a cooling fin 90.

According to Japanese Laid-open Patent Publication No. 2007-88045, a curve corresponding to each of the insulating substrates 71 and 72 is formed without taking a curve of the entire radiator plate 73 into consideration. This may lead to considerable curve deformation of the entire radiator plate 73. If considerable initial curving is performed, the following problems, for example, tend to arise. A semiconductor chip mounted over the insulating substrate 71 or 72 at assembly time shifts, or a void appears in solder between the insulating substrate 71 or 72 and the radiator plate 73.

Furthermore, the insulating substrates 71 and 72 are simply placed over the radiator plate 73. Therefore, as described in FIGS. 13A and 13B, the bottom of the concave curve may be positioned under the rigid insulating substrate 72 having high rigidity. In that case, stress concentrates in the clearance 75 between the insulating substrates 71 and 72 having low rigidity and a crack tends to appear in solder by which the insulating substrate 72 is adhered to the radiator plate 73. In addition, an end portion of the insulating substrate 72 is lifted up in the clearance 75 between the insulating substrates 71 and 72 and a gap tends to appear between the radiator plate 73 and the cooling fin.

Furthermore, Japanese Laid-open Patent Publication No. 2008-91959 does not state that when the insulating substrates of different shapes are soldered to the radiator plate in order to prevent the above troubles, a bottom of the curve (initial curving) formed on the radiator plate before the soldering is positioned under clearance between the insulating substrate.

SUMMARY

According to an aspect of the embodiments to be discussed herein, there is provided a semiconductor module radiator plate fabrication method which includes: soldering a plurality of insulating substrates of different shapes to a flat radiator plate, and forming a convex curve on an insulating substrate side of the radiator plate; obtaining a first concave curve by reversing the convex curve; setting a second concave curve on an insulating substrate side of a radiator plate after soldering, a bottom of the second concave curve being positioned under clearance between the plurality of insulating substrates; adding the first curve and the second curve to calculate a third concave curve on the insulating substrate side; and forming the third curve on a flat plate to form a radiator plate before soldering.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 12 is a schematic sectional view of a radiator plate to which two insulating substrates of different shapes are soldered.

DESCRIPTION OF EMBODIMENTS

Embodiments will be described by the following examples.

Example 1

Figure 1:
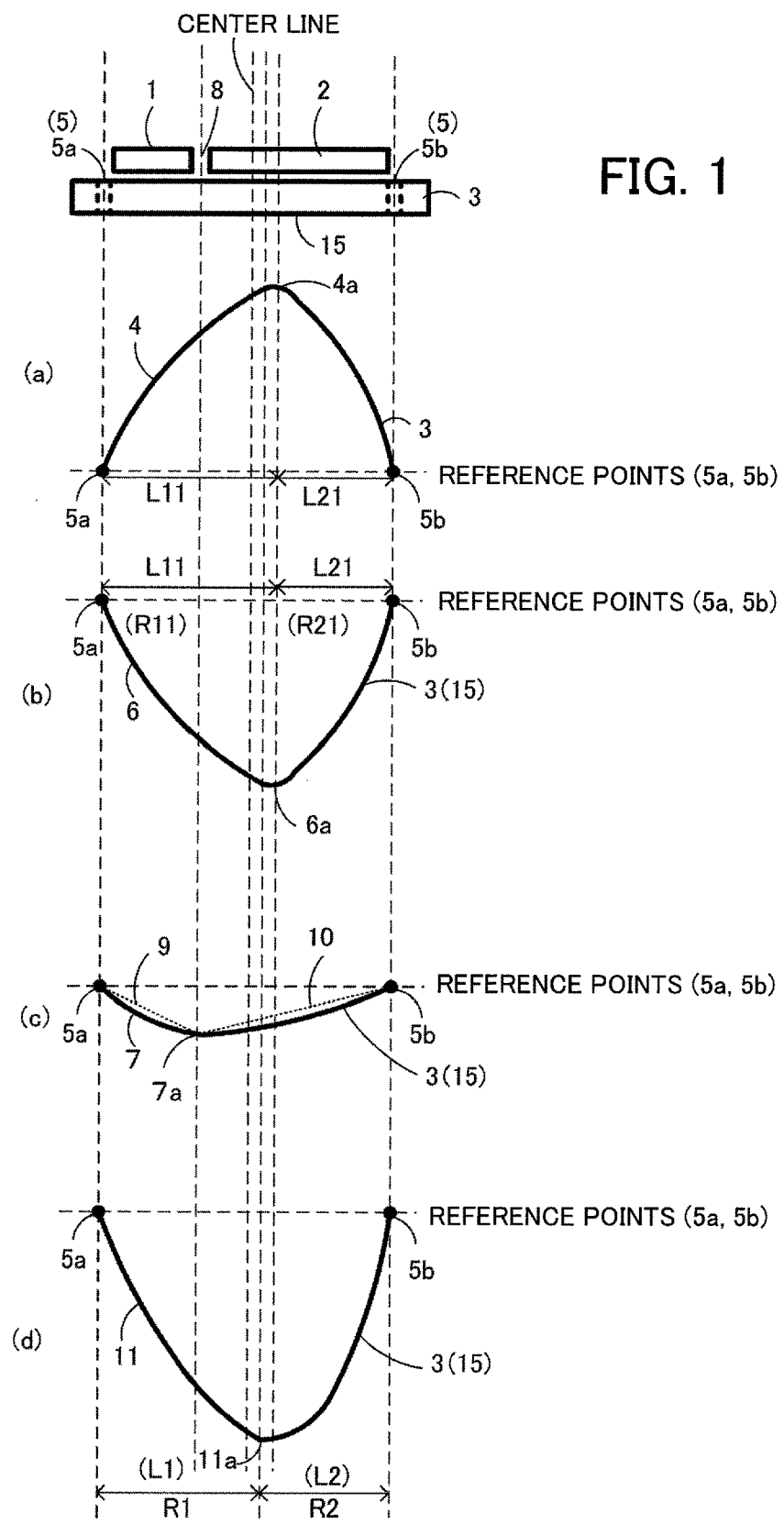
FIG. 1 illustrates a semiconductor module radiator plate fabrication method according to a first example, where (a) to (d) are fragmentary sectional views of steps indicated in order.

FIG. 1 illustrates a semiconductor module radiator plate fabrication method according to a first example, and parts (a) to (d) of FIG. 1 are fragmentary sectional views of steps indicated in order. A case where two insulating substrates of different shapes are soldered to a radiator plate is taken as an example. The topmost figure illustrates the arrangement of two insulating substrates 1 and 2 of different shapes and a radiator plate 3. In the following description each radiator plate is indicated uniformly by the numeral 3.

First the flat radiator plate 3 and the two insulating substrates 1 and 2 of different shapes which differ in area are prepared for data acquisition. The insulating substrates 1 and 2 are soldered to determined positions on one of the radiator plate 3. As illustrated in part (a) of FIG. 1, a convex curve 4 with a top 4a formed on an insulating substrate (insulating substrates 1 and 2) side of the radiator plate 3 is measured. In this case, the shape from above of each of the insulating substrates 1 and 2 and the radiator plate 3 is rectangular. Furthermore, each of the insulating substrates 1 and 2 is arranged so that its one side will be parallel to a long side of the radiator plate 3.

The top 4a of the convex curve 4 is positioned under the large insulating substrate 2. The distance L11 between the top 4a and a reference point 5a on a small insulating substrate 1 side is longer than the distance L21 between the top 4a and a reference point 5b on a large insulating substrate 2 side.

Figure 2:
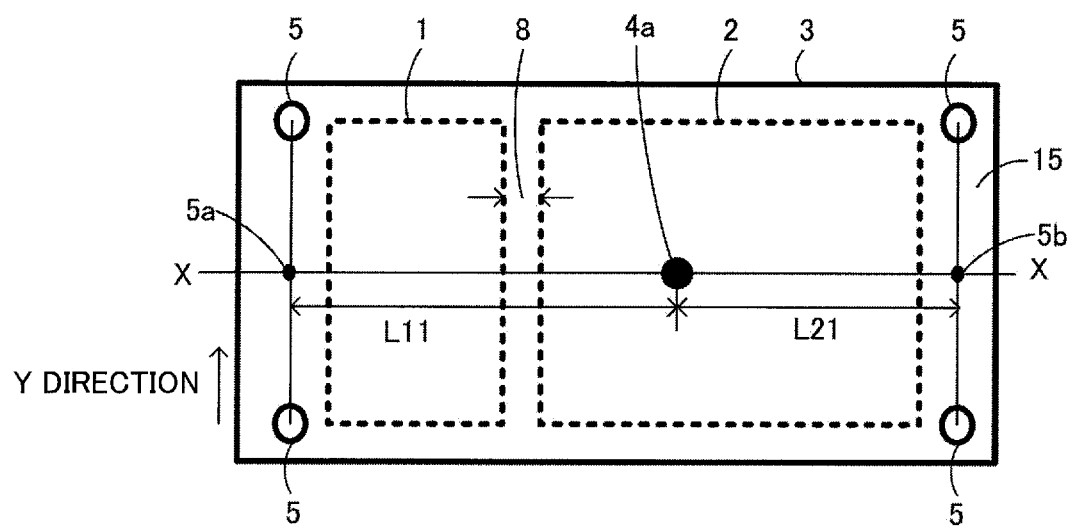
FIG. 2 is a fragmentary plan view which illustrates a state in which, as a result of soldering two insulating substrates of different shapes to a flat radiator plate, a convex curve is formed on an insulating substrate side of the radiator plate.

As illustrated in FIG. 2, to measure the convex curve 4, the intersections on a back 15 side of the radiator plate 3 of straight lines (in a Y direction) which connect the centers of clamp holes 5 made in a periphery of the radiator plate 3 and a straight line drawn in an X direction through the top 4a of the curve 4 are used as reference points 5a and 5b for measurement, scanning is performed on an X-X line which connects the reference points 5a and 5b by the use of a probe of a measuring device (not illustrated), and a depth profile is obtained. The same applies to the following curves.

Next, as illustrated in part (b) of FIG. 1, a concave curve is obtained as a first curve 6 by turning the measured convex curve 4 illustrated in part (a) of FIG. 1 upside down (that is the concave curve obtained by reversing the curve 4 with respect to the X-X line or an X-Y plane including the reference points 5a and 5b). A bottom 6a of the first curve 6 is positioned under the large insulating substrate 2. The first curve 6 has a first portion defined by the distance (L11) between the bottom 6a of the first curve 6 and the reference point 5a and also has a second of a portion defined by the distance (L21) between the bottom 6a of the first curve 6 and the reference point 5b. The first portion is longer than the second portion. The curvature R11 of the first portion is smaller than the curvature R21 of the second portion. That is to say, curvature R11 (gentle curve)<curvature R21 (sharp curve).

Next, as illustrated in part (c) of FIG. 1, a concave curve of the radiator plate 3 to be realized at the time of soldering the insulating substrates 1 and 2 to the determined positions is specified. The specified concave curve is set as a second curve 7. In this case, the second curve 7 is specified so that a bottom 7a of the second curve 7 will be positioned under clearance 8 between the two insulating substrates 1 and 2 and so that the second curve 7 will be concave on the insulating substrate (insulating substrates 1 and 2) side. The second curve 7 is practically identical to a desired curve to be generated by actually soldering the insulating substrates 1 and 2 of different shapes to the radiator plate 3. When three or more insulating substrates are soldered to the radiator plate 3, it is desirable that the bottom 7a of the second curve 7 be positioned under clearance between, for example, the insulating substrates 1 and 2 which are near the center of the radiator plate 3. Furthermore, as indicated by dotted lines, two straight lines 9 and 10 may be drawn between the bottom 7a of the second curve 7 and the reference points 5a and 5b. In this case, a second plane is obtained as a surface. However, if the radiator plate 3 is concavely curved downward by the two straight lines 9 and 10, then clearance appears at the time of fixing the radiator plate 3 onto a cooling fin. It is preferable to avoid the appearance of clearance. If the second curve 7 is represented by the two straight lines 9 and 10, then the relationship "curvature R1<curvature R2" regarding a third curve 11 illustrated in part (d) of FIG. 1 becomes more significant.

Next, as illustrated in part (d) of FIG. 1, a profile of the second curve 7 is superimposed on a profile of the first curve 6. By doing so, an addition is performed to calculate a profile of the third concave curve 11. A bottom 11a of the third curve 11 is positioned near the bottom 6a of the first curve 6. The third curve 11 has a shape for canceling out a convex curve formed on the insulating substrate (insulating substrates 1 and 2) side at the time of soldering and for forming the second concave curve 7. The third curve 11 is a curve of the radiator plate 3 before soldering (initial curving). A curvature R1 of a portion of the third curve 11 for which the distance (L1) between the bottom 11a of the third curve 11 and the reference point 5a is longer is smaller than a curvature R2 of a portion of the third curve 11 for which the distance (L2) between the bottom 11a of the third curve 11 and the reference point 5b is shorter. That is to say, curvature R1 (gentle curve)<curvature R2 (sharp curve).

In addition, the position of the bottom 11a of the third curve 11 is approximately identical to that of the bottom 6a of the first curve 6.

When the insulating substrates 1 and 2 of different shapes are soldered to the determined positions on the radiator plate 3 having the third curve 11, then the radiator plate 3 having a fourth curve 21 (see FIG. 5) close to the second curve 7 is obtained. This radiator plate 3 is included in a semiconductor module.

For the sake of simplicity one dimension has been described above, but in reality concave curves are two-dimensionally measured to obtain the first curve 6, the second curve 7, and the third curve 11.

In this example, as stated above, the shape of the third curve 11 is determined from a curve of the entire radiator plate 3. With Japanese Laid-open Patent Publication No. 2007-88045, curves are determined according to insulating substrates and these curves are combined to determine an entire curve. In this example, on the other hand, the third curve 11 does not become too sharp. Accordingly, when the radiator plate 3 is fixed onto the cooling fin, it is possible to prevent a crack from appearing in solder between the insulating substrates 1 and 2 and the radiator plate 3.

Furthermore, as stated above, the third curve 11 is calculated from the first curve 6 found by the experiment and the set second curve 7. Therefore, the management of the third curve 11 is not so complex as the management of conventional curves and is easy.

Example 2

Figure 3A:
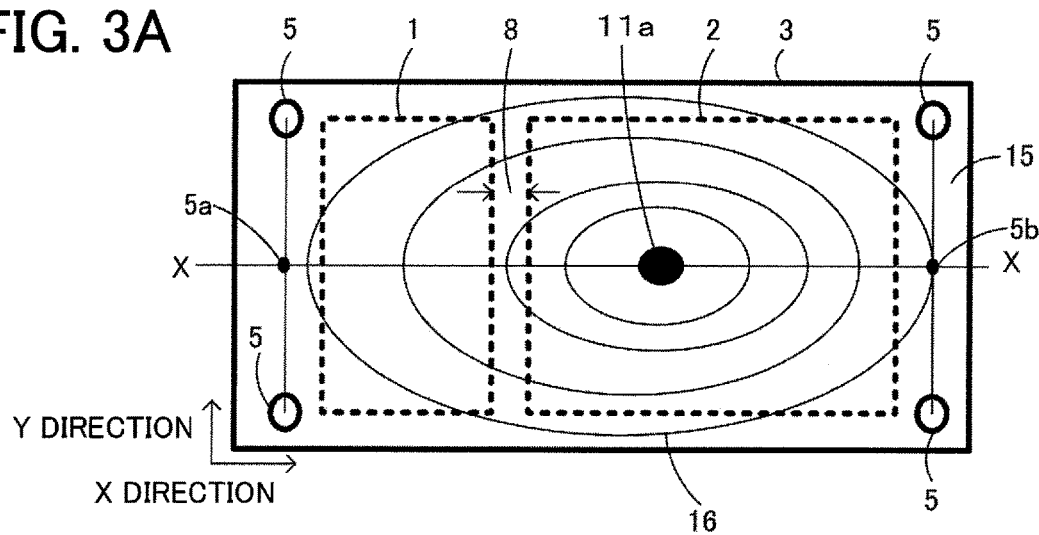
FIGS. 3A and 3B are views which illustrate the structure of a semiconductor module radiator plate according to a second example, FIG. 3A being a fragmentary plan view which illustrates the structure of a semiconductor module radiator plate according to a second example, FIG. 3B being a fragmentary sectional view taken along lines X-X of FIG. 3A.
Figure 3B:
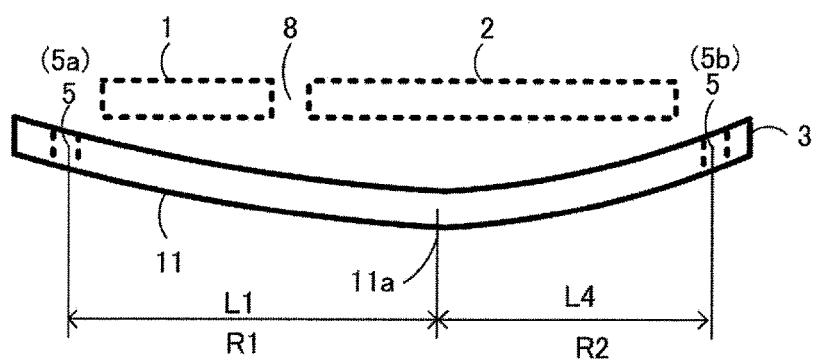

FIGS. 3A and 3B are views which illustrate the structure of a semiconductor module radiator plate according to a second example. FIG. 3A is a fragmentary plan view which illustrates the structure of a semiconductor module radiator plate according to a second example. FIG. 3B is a fragmentary sectional view taken along lines X-X of FIG. 3A.

Part (d) of FIG. 1 illustrates only the curve in the X direction. In this example, however, the fabrication method according to the first example is extended to a surface. A curve in the Y direction is also measured by the same technique and a two-dimensional curve illustrated in FIG. 3A is obtained. A bottom 11a of the two-dimensional curve is the same as the bottom 11a of the third curve 11. In this case, it is assumed that the third curve 11 is also used as a two-dimensional curve. The numeral 16 in FIG. 3A indicates a contour line of the third curve 11.

On the radiator plate 3 in FIGS. 3A and 3B on which the third concave curve 11 is formed, the bottom 11a of the third curve 11 is positioned near the bottom 6a of the above first curve 6 and a curvature R1 of a portion of the third curve 11 for which the distance (L1) between the bottom 11a of the third curve 11 and the reference point 5a is longer is smaller than a curvature R2 of a portion of the third curve 11 for which the distance (L2) between the bottom 11a of the third curve 11 and the reference point 5b is shorter (R1<R2). One reason for this is that the curvature R11 of the portion of the first curve 6 in part (b) of FIG. 1 for which the distance (L11) between the bottom 6a of the first curve 6 and the reference point 5a is longer is smaller than the curvature R21 of the portion of the first curve 6 for which the distance (L21) between the bottom 6a of the first curve 6 and the reference point 5b is shorter.

Figure 4A:
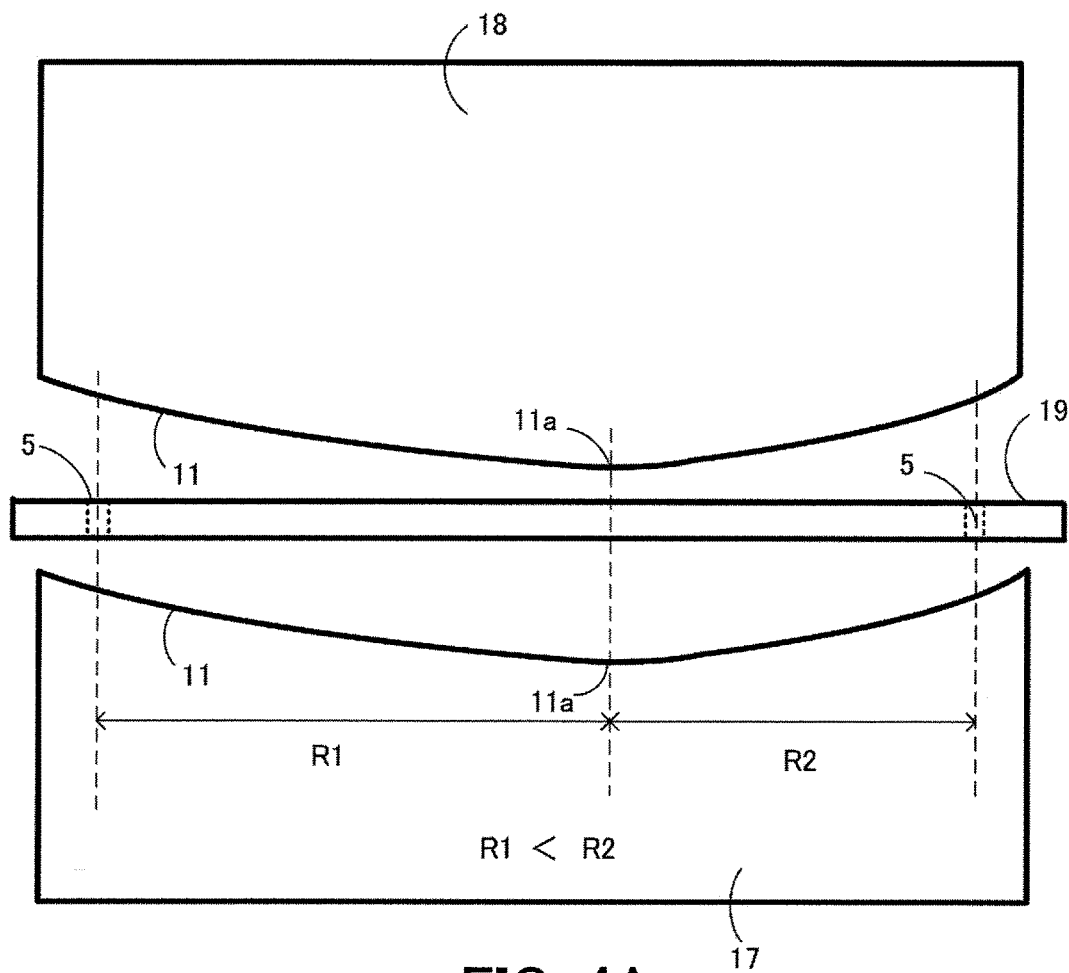
FIGS. 4A and 4B are views for describing a concrete method for fabricating the radiator plate illustrated in FIGS. 3A and 3B, FIG. 4A being a view which illustrates a flat plate put between dies, FIG. 4B being a view which illustrates a radiator plate fabricated by pressing the flat plate between the dies.
Figure 4B:
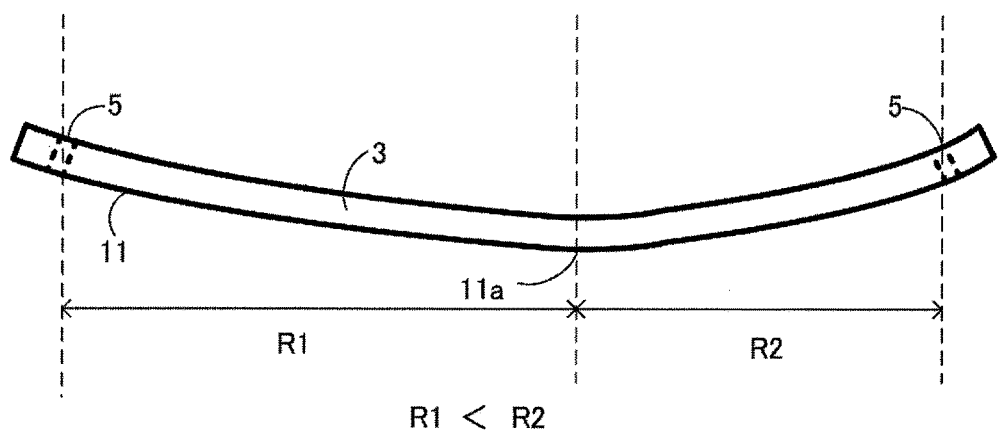

FIGS. 4A and 4B are views for describing a concrete method for fabricating the radiator plate illustrated in FIGS. 3A and 3B. FIG. 4A is a view which illustrates a flat plate put between dies. FIG. 4B is a view which illustrates a radiator plate fabricated by pressing the flat plate between the dies. A concave die 17 and a convex die 18 each having the above third curve 11 are made. A flat plat 19 made of copper or a copper alloy is put between the concave die 17 and the convex die 18 and is pressed between them. By doing so, the radiator plate having the third curve 11 is fabricated. The clamp holes 5 are made in the periphery of the radiator plate 3. The straight lines which connect the centers of the clamp holes 5 are needed for determining the reference points 5a and 5b (see FIGS. 2 and 3) used for measuring the curvatures R1 and R2 of the third curve 11.

Example 3

Figure 5:
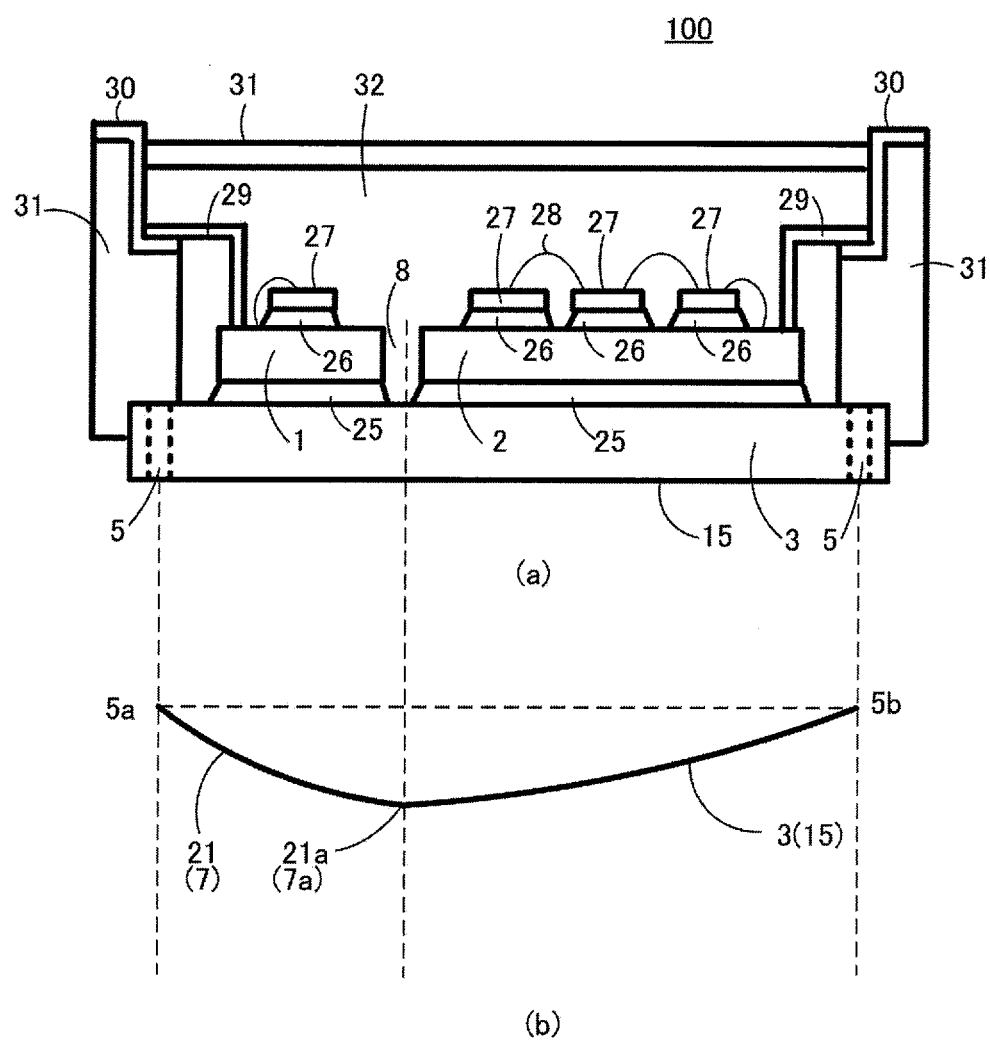
FIG. 5 illustrates fragmentary sectional views of a semiconductor module according to a third example, where (a) is a fragmentary sectional view of an entire semiconductor module, and (b) is a fragmentary sectional view of a curve of a back of the radiator plate of (a)

FIG. 5 illustrates fragmentary sectional views of a semiconductor module according to a third example. Part (a) of FIG. 5 is a fragmentary sectional view of an entire semiconductor module. Part (b) of FIG. 5 is a fragmentary sectional view of a curve of a back of the radiator plate of part (a) of FIG. 5. The radiator plate 3 illustrated in FIGS. 3A and 3B is used in a semiconductor module 100.

The semiconductor module 100 includes the radiator plate 3, insulating substrates with a conductive pattern (above insulating substrates 1 and 2) back conductive films (not illustrated) of which are adhered to the radiator plate 3 with solder 25 between, semiconductor chips 27 adhered to a conductive pattern (not illustrated) of the radiator plate 3 with solder 26 between, bonding wires 28 which connect surface electrodes (not illustrated) of the semiconductor chips 27 and the conductive patterns, wiring conductors 29 one end of each of which is connected to a conductive pattern, lead-out terminals 30 to each of which the other end of each of the wiring conductor 29 is adhered, a resin case 31 to which the lead-out terminals 30 are adhered, and gel 32 with which the resin case 31 is filled.

The insulating substrates 1 and 2 are soldered to the radiator plate 3 having the third curve. By doing so, a bottom 21a of the fourth concave curve 21 of the radiator plate 3 is positioned under the clearance 8 between the insulating substrates 1 and 2. The fourth curve 21 is very close to the above second curve 7.

Figure 6:
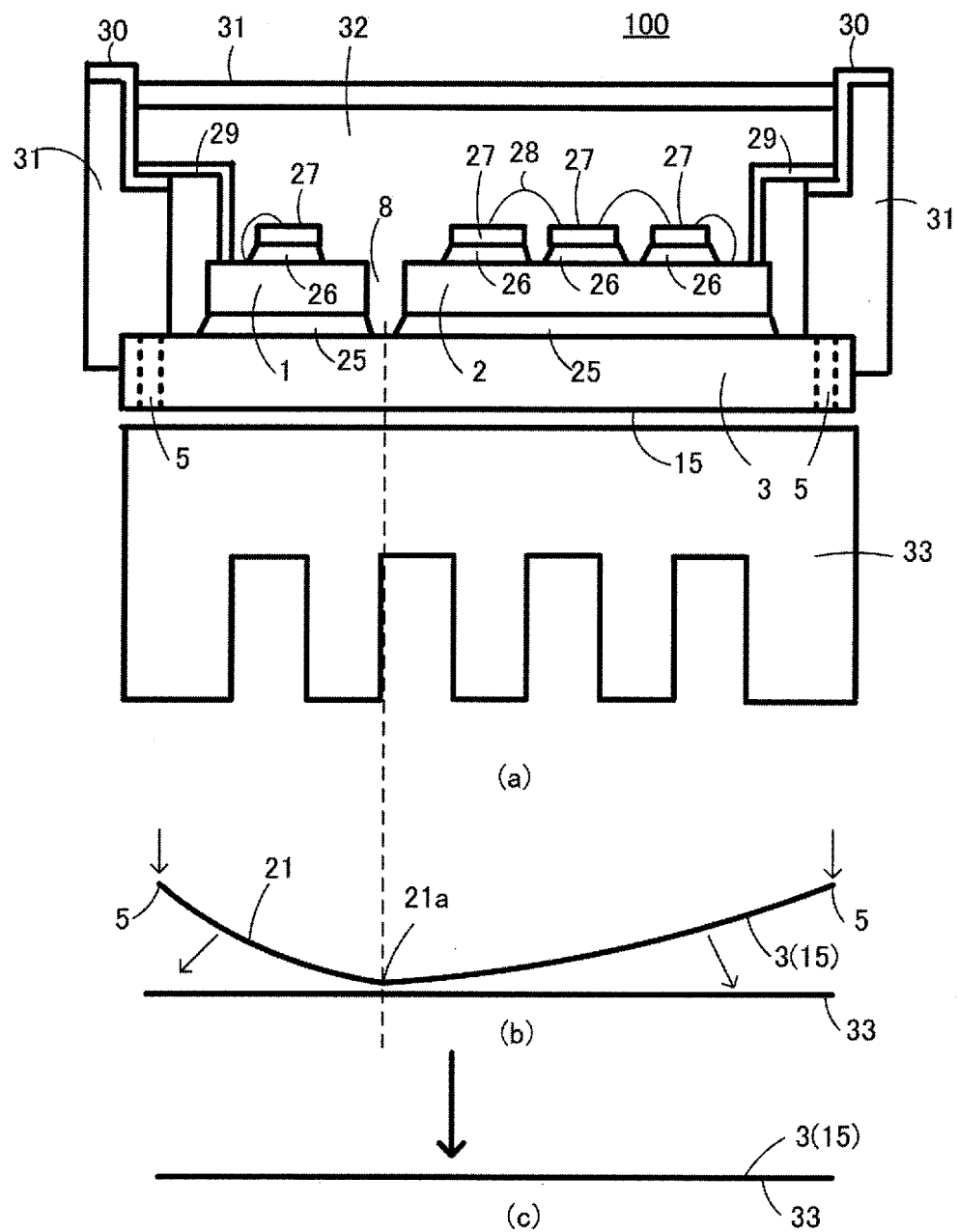
FIG. 6 illustrates fragmentary sectional views of the semiconductor module radiator plate of FIG. 5 fixed onto a cooling fin by the use of clamp holes, where (a) is a fragmentary sectional view of the whole of the semiconductor module and a cooling fin, (b) is a fragmentary sectional view of the curve of the back of the radiator plate, and (c) is a fragmentary sectional view which illustrates the back of the radiator plate in a flat state after fixing the radiator plate onto a cooling fin.
Figure 7:
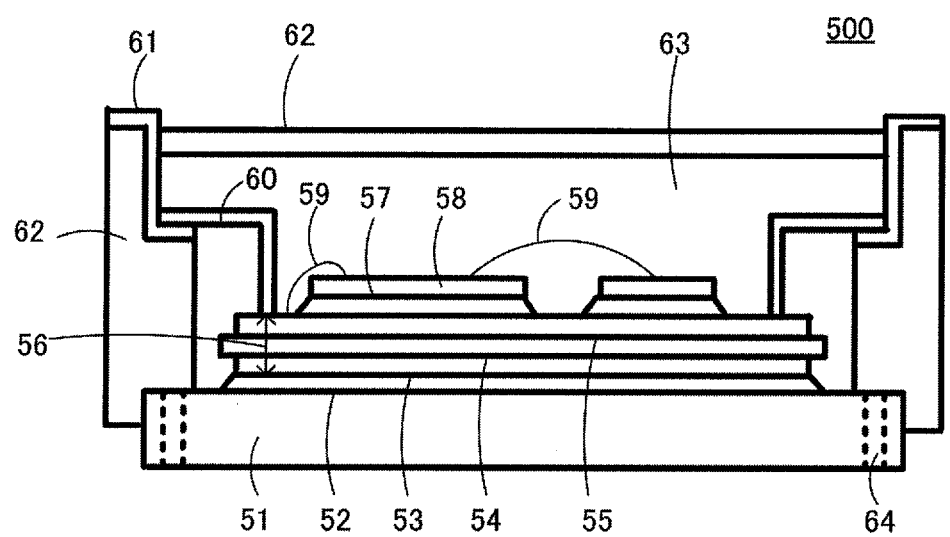
FIG. 7 is a fragmentary sectional view of a semiconductor module.
Figure 8:
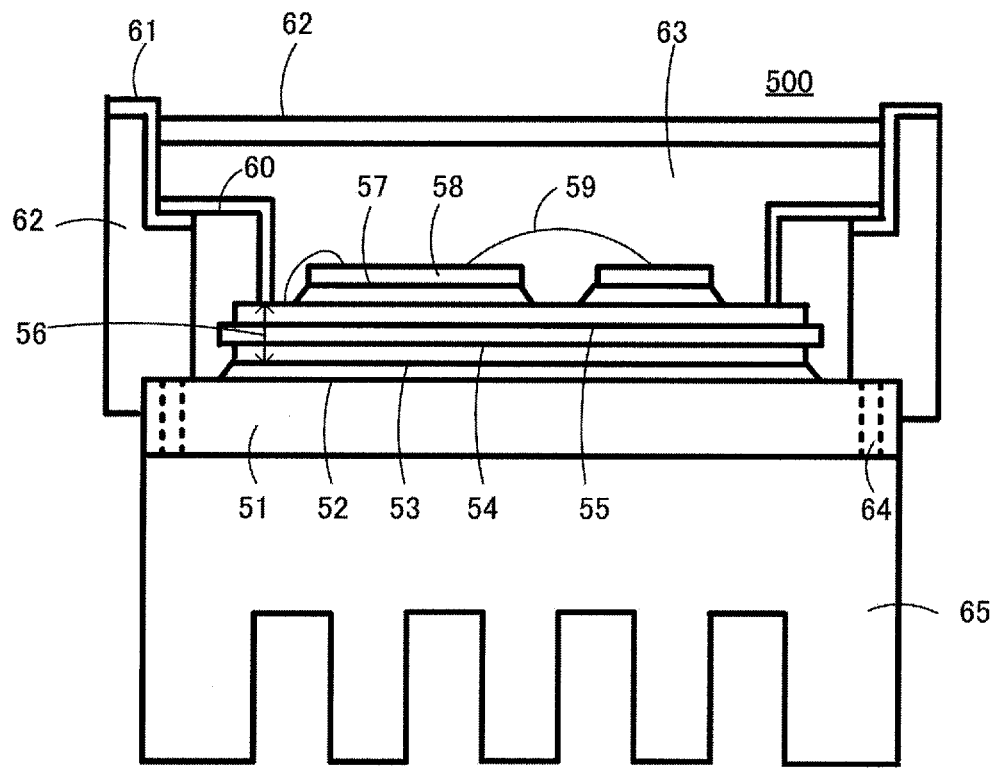
FIG. 8 is a fragmentary sectional view of the semiconductor module fixed onto a cooling fin.
Figure 9:
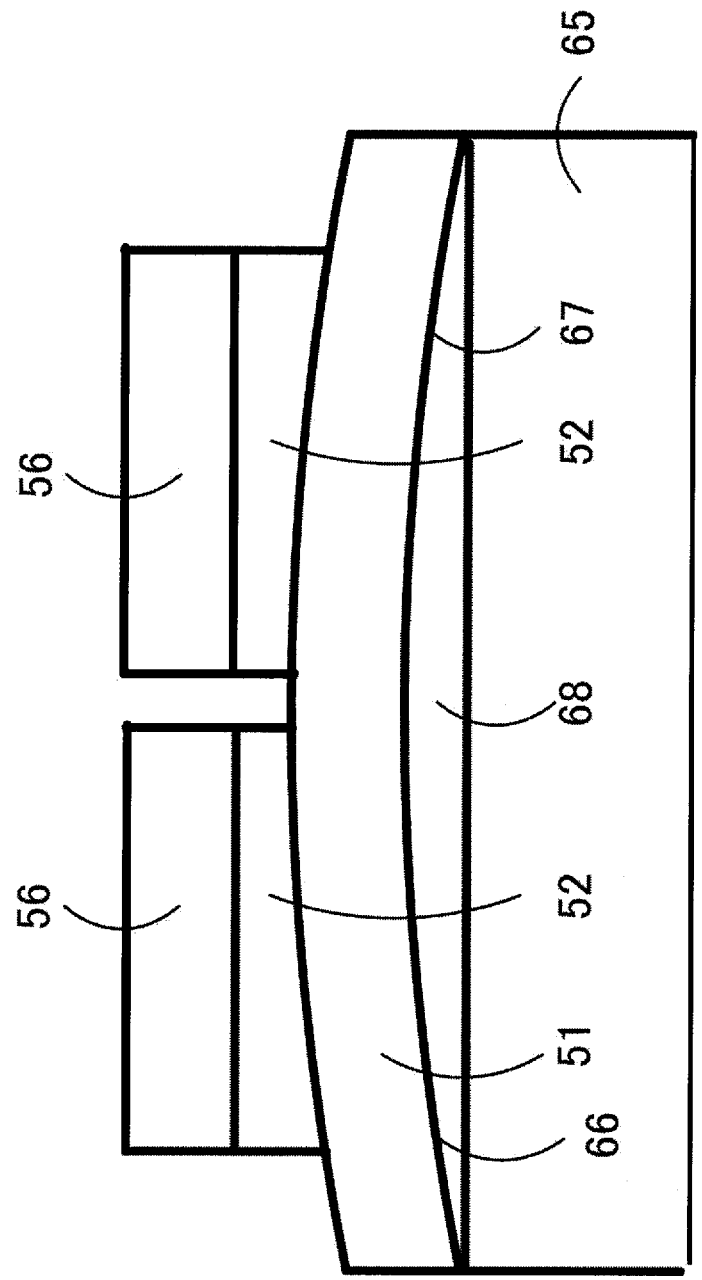
FIG. 9 is a schematic sectional view of a flat radiator plate to which two insulating substrates of the same shape are soldered.
Figure 10:
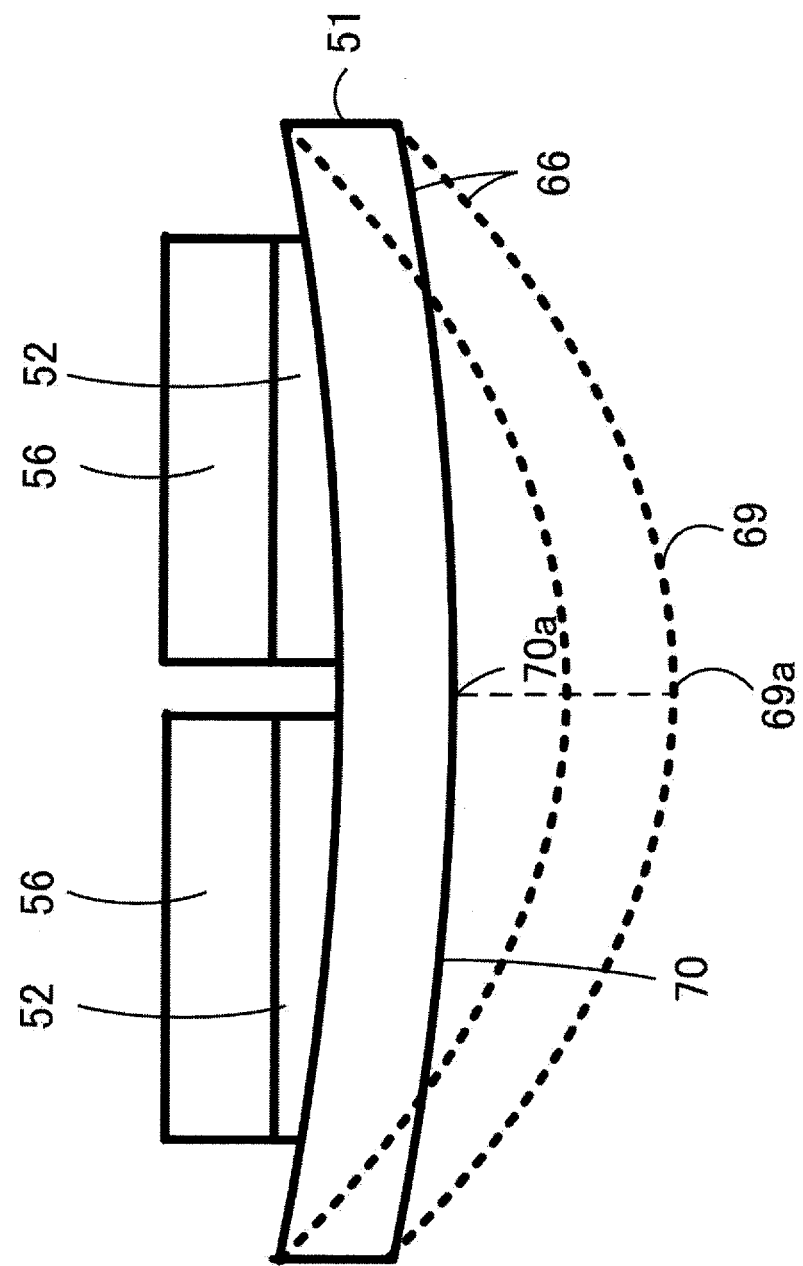
FIG. 10 is a schematic sectional view of a concave curve formed for canceling out the convex curve of the radiator plate illustrated in FIG. 9.
Figure 11:
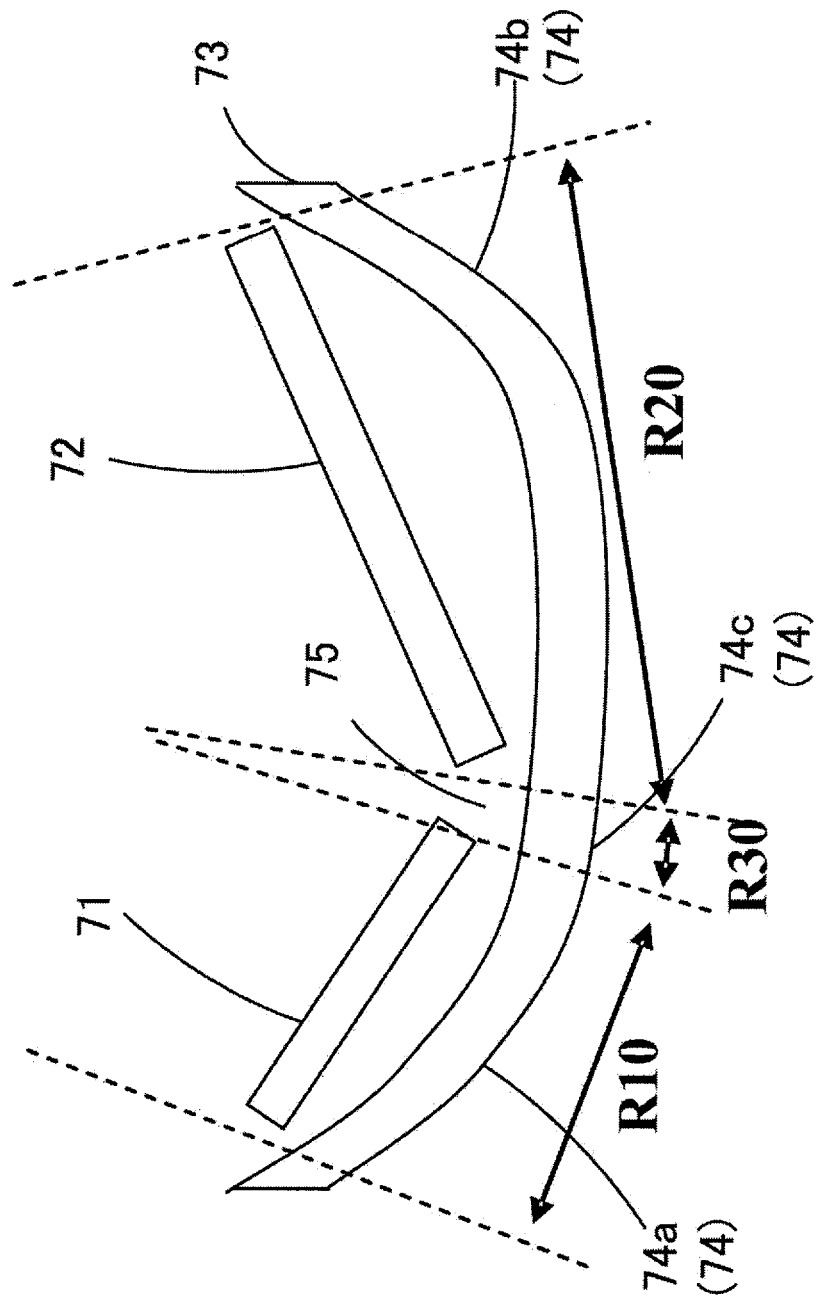
FIG. 11 is a schematic sectional view of a curve of a radiator plate before soldering insulating substrates of different shapes to the radiator plate, which is described in Japanese Laid-open Patent Publication No. 2007-88045.
Figure 13A:
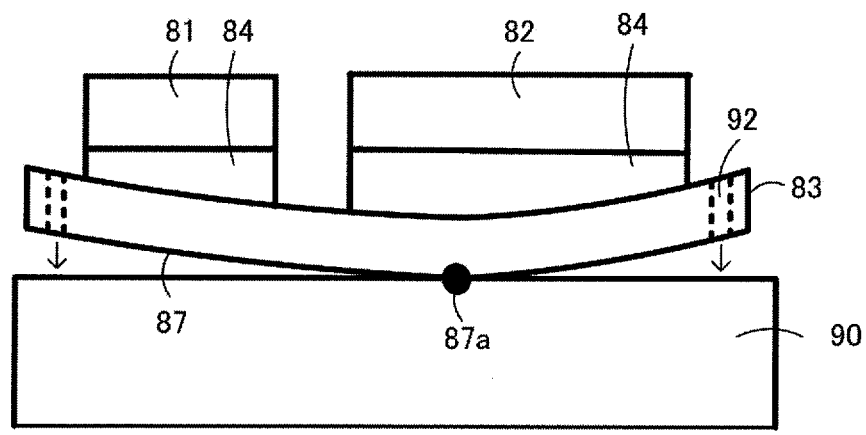
FIGS. 13A and 13B are schematic views of the radiator plate of FIG. 12 before and after being fixed onto a cooling fin, FIG. 13A being a schematic view of the radiator plate before being fixed onto the cooling fin, FIG. 13B being a schematic view of the radiator plate after being fixed onto the cooling fin.
Figure 13B:
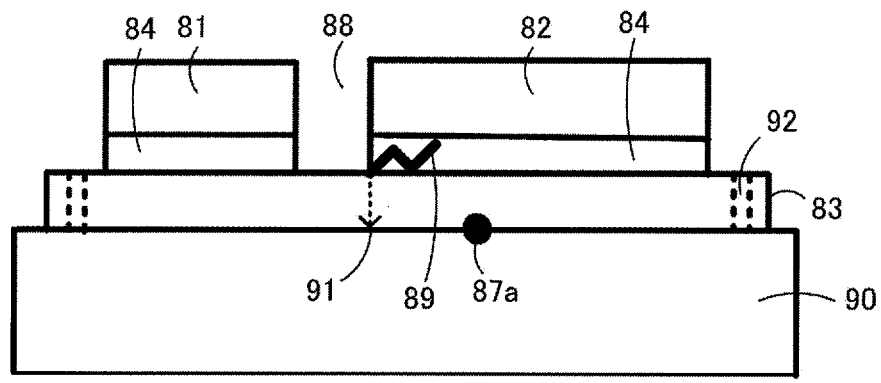

FIG. 6 illustrates fragmentary sectional views of the semiconductor module radiator plate of FIG. 5 fixed onto a cooling fin by the use of clamp holes. Part (a) of FIG. 6 is a fragmentary sectional view of the whole of the semiconductor module and a cooling fin. Part (b) of FIG. 6 is a fragmentary sectional view of the curve of the back of the radiator plate. Part (c) of FIG. 6 is a fragmentary sectional view which illustrates the back of the radiator plate in a flat state after fixing the radiator plate onto a cooling fin.

The bottom 21a of the fourth concave curve 21 of the radiator plate 3 is positioned under the clearance between the insulating substrates 1 and 2, so the radiator plate 3 having low rigidity is pressed against a cooling fin 33 with the bottom 21a of the fourth curve 21 and the clamp holes 5 of the radiator plate 3 as supporting points. At this time there is no supporting point (bottom 21a of the fourth curve 21) in the insulating substrate 2 having high rigidity. As a result, the whole of the back 15 of the radiator plate 3 adheres closely to the cooling fin 33 and the appearance of a gap between the radiator plate 3 and the cooling fin 33 is prevented.

As stated above, in this embodiment the shape of the third curve 11 is determined from a curve of the entire radiator plate 3, so the third curve 11 does not become too sharp. Accordingly, when the radiator plate 3 is fixed onto the cooling fin 33, the appearance of a crack in the solder 25 between the insulating substrates 1 and 2 and the radiator plate 3 is prevented.

A material for the above radiator plate 3 is copper, a copper alloy (C19220 or C19210, for example), or the like. Furthermore, insulating plates made of alumina, aluminum nitride, silicon nitride, or the like are used as the insulating substrates 1 and 2 mounted over the radiator plate 3.

According to the present invention, when insulating substrates of different shapes are soldered to a radiator plate, a third concave curve is formed in advance on an insulating substrate side of the radiator plate. The third curve is determined by adding a second concave curve which is expected at the time of actually soldering the insulating substrates of different shapes to the radiator plate to a first concave curve obtained by moving upside down a convex curve which appears at the time of soldering the insulating substrates of different shapes to a flat radiator plate. A bottom of the third curve is positioned under a large insulating substrate and a curvature of a portion of the third curve for which the distance between this bottom and a reference point determined on the basis of the clamping of the radiator plate is longer is made smaller than a curvature of a portion of the third curve for which the distance between the bottom and a reference point determined on the basis of the clamping of the radiator plate is shorter.

A bottom of a concave portion of the radiator plate is positioned between the insulating substrates. As a result, when the radiator plate is attached to a cooling fin, a crack does not appear in solder. In addition, a gap between the radiator plate and the cooling fin is made narrow. Accordingly, heat radiation properties can be improved.

Furthermore, the third curve is calculated from a first curve found by actual measurement and the set second curve. Accordingly, the management of the third curve is not so complex as the management of conventional curves and is easy.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module radiator plate fabrication method comprising:
   soldering a first insulating substrate and a second insulating substrate of different respective shapes to a surface of a flat radiator plate such that the first insulating substrate and the second insulating substrate are spaced apart from each other by a clearance, and forming a convex curve on the surface of the radiator plate;
   obtaining a first concave curve by vertically flipping a representation of the convex curve in a coordinate system, the first concave curve being concave in an upward direction in the coordinate system;
   setting a second concave curve that is concave in the upward direction in the coordinate system, a bottom of the second concave curve being at a position on the second concave curve that corresponds to a position of the clearance between the first insulating substrate and the second insulating substrate;
   adding the first curve and the second curve to calculate a third concave curve; and
   implementing the third concave curve in another radiator plate by forming the another radiator plate so as to have a concave surface having the third curve, before soldering two additional insulating substrates to the concave surface of the another radiator plate.

2. The method according to claim 1, further comprising:
   soldering the two additional insulating substrates to the concave surface of the another radiator plate, the two additional insulating substrates having areas substantially the same as those of the first and second insulating substrates, respectively.

3. The method according to claim 2, wherein
   the first insulating substrate is larger in area than the second insulating substrate,
   the two additional insulating substrates include a first additional insulating substrate and a second additional insulating substrate having areas substantially the same as those of the first and second insulating substrates, respectively, and
   in the soldering the two additional insulating substrates to the concave surface of the another radiator plate,
      a bottom of the concave surface is positioned under the first additional insulating substrate, and
      a curvature of a portion of the concave surface under the second additional insulating substrate is smaller than a curvature of a portion of the concave surface under the first additional insulating substrate.

4. The method according to claim 3, wherein
   in the soldering the two additional insulating substrates, the first additional insulating substrate and the second additional insulating substrate are spaced apart from each other by a second clearance,
   the soldering the two additional insulating substrates causes the concave surface of the another radiator plate to have the second concave curve, and
   after the soldering the two additional insulating substrates, a bottom of the concave surface is below the second clearance.

5. The method according to claim 1, wherein a material for the ceramic plate of each of the insulating substrates is alumina, aluminum nitride, or silicon nitride.

6. A semiconductor module radiator plate fabrication method, the method using a radiator plate that is flat and is used for measurement, another radiator plate that is flat, a plurality of first insulating substrates, a plurality of second insulating substrates, the first insulating substrates having a shape different from the second insulating substrates, the method comprising:
   soldering one of the first insulating substrates and one of the second insulating substrates onto a first surface of the radiator plate such that the one first insulating substrate and the one second insulating substrate have a clearance therebetween, thereby forming a convex curve in a first direction in the radiator plate, the first surface facing the first direction;

turning the radiator plate having the convex curve upside down to thereby obtain the radiator plate having a first concave curve in a second direction, the second direction being opposite to the first direction;

measuring the first concave curve;

defining a second concave curve in the second direction that is a desired curve to be obtained in the another radiator plate by soldering another one of the first insulating substrates and another one of the second insulating substrates to the another radiator plate, the second concave curve having a lowest point at a position corresponding to the clearance;

calculating a third concave curve in the second direction by adding the first concave curve and the second concave curve, the third concave curve being a curve to be actually formed in the another radiator plate before soldering the another first insulating substrate and the another second insulating substrate to the another radiator plate; and forming the third concave curve in the another radiator plate.

* * * * *